United States Patent
Ferrell

(10) Patent No.: US 7,078,340 B2
(45) Date of Patent: *Jul. 18, 2006

(54) METAL DEPOSIT PROCESS

(75) Inventor: Gary W. Ferrell, Half Moon Bay, CA (US)

(73) Assignee: SEZ AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 09/774,303

(22) Filed: Jan. 29, 2001

(65) Prior Publication Data

US 2001/0019888 A1    Sep. 6, 2001

Related U.S. Application Data

(63) Continuation of application No. 09/371,296, filed on Aug. 9, 1999, now Pat. No. 6,180,524.

(51) Int. Cl.
*H01L 21/44* (2006.01)
(52) U.S. Cl. .................... 438/678; 438/687
(58) Field of Classification Search ............ 438/687, 438/584, 686, 678
See application file for complete search history.

(56) References Cited

U.S. PATENT DOCUMENTS

| 4,908,242 | A  | * | 3/1990  | Hughes et al. ........... 427/443.1 |
| 5,750,018 | A  | * | 5/1998  | Brasch ..................... 205/295 |
| 6,178,623 | B1 | * | 1/2001  | Kitazawa et al. ............ 29/825 |
| 6,180,524 | B1 | * | 1/2001  | Ferrell ...................... 438/687 |
| 6,197,181 | B1 | * | 3/2001  | Chen ........................ 205/123 |
| 2003/0196989 | A1 | * | 10/2003 | Zhou et al. .................. 216/2 |

* cited by examiner

*Primary Examiner*—Tuan H. Nguyen
(74) *Attorney, Agent, or Firm*—Schneck & Schneck; Thomas Schneck

(57) ABSTRACT

Method and system for controllable deposit of copper onto an exposed surface of a workpiece, such as a semiconductor surface. A seed thickness of copper is optionally deposited onto the exposed surface, preferably using oxygen-free liquid ammonia to enhance this deposition. The workpiece exposed surface is then immersed in an electroplating solution, including copper and liquid ammonia at a suitable pressure and temperature, and copper is caused to plate onto the exposed surface at a controllable rate. When the copper deposited on the exposed surface reaches a selected total thickness, electroplating is discontinued, the electroplating solution is removed, and the gaseous and liquid ammonia are recovered and recycled for re-use.

35 Claims, 4 Drawing Sheets

METAL DEPOSIT PROCESS

This is a continuation of patent application, U.S. Ser. No. 09/371,296 filed Aug. 9, 1999, now U.S. Pat. No. 6,180,524.

FIELD OF THE INVENTION

This invention relates to generation and deposition of copper metal on a selected surface, such as a semiconductor substrate.

BACKGROUND OF THE INVENTION

Replacement of aluminum surfaces and contacts in a semiconductor circuit by copper surfaces and contacts is attractive, for several reasons. Copper has nearly as high a relative electrical conductivity coefficient as silver (100 versus 106) and is much higher than the corresponding coefficient for gold (65), for aluminum (59) and for any other metal. The thermal conductivity coefficient for copper is also much higher than the corresponding thermal conductivity coefficient for aluminum. Copper has a higher melt temperature than aluminum (660° C. versus 1083° C.). Copper will form an oxidized surface when exposed to oxygen but will not form some of the disagreeable surface contaminants that aluminum forms under similar conditions. Use of a metal with higher electrical conductivity will allow use of smaller driving voltages, as low as 1.8 volts, and possibly lower, which in turn will not produce as much heat to be dissipated from the chip or other semiconductor device. Use of a metal with higher electrical conductivity and higher thermal conductivity will also allow choice of a greater range of lead frame materials for use with these devices.

However, generation and controllable deposition of a copper metal of a selected small thickness on a semiconductor surface or electrical contact is problematical, in part because such copper processes have not been developed as thoroughly as the corresponding aluminum processes. Cu has a modest electrode or reducing potential at T=25° C. ($E^0$=0.32–0.34 volts), as compared to Ag, Au and Pt, for which $E^0$ is of the order or 1 volt, and Al, for which $E^0$ is about −1.7 volts. Cu has several oxidization states, as does Al.

What is needed is an approach for generation and controlled deposition of a selected thickness of copper metal on an exposed surface, such as a semiconductor material, of a workpiece, using pressures that may range from normal atmospheric pressure to several hundred psig, and using temperatures that may range from around −78° C. to around 100° C. Preferably, the approach should allow control of the rate of deposit of copper and the total thickness of copper deposited, through control of parameters such as ambient temperature, deposition time interval and electrodeposition voltage used.

SUMMARY OF THE INVENTION

These needs are met by the invention, which provides method and system for generation and controlled deposition of a selected thickness of copper metal on an exposed surface, using a fluid that includes a mixture of liquid ammonia ($NH_3$) and a copper halide ($CuCl_a$, $CuBr_b$, $CuI_c$, with a, b and c≈1–2) or a copper amine ($NCuR_1R_2$), maintained at a pressure sufficient to maintain the ammonia in liquid form. For example, at temperatures of T=−33° C. and T=20° C., the minimum pressures required to maintain ammonia in liquid form are 0 psig and 115 psig, respectively.

A seed thickness of copper is first deposited on one or more exposed wafer or workpiece surfaces. Elecetroless deposition and/or electroplating of copper from a copper salt/liquid ammonia solution is then carried out to deposit the desired total thickness of copper onto the copper-seeded workpiece surface(s). The ammonia fluid (liquid and/or gas) is recovered and optionally recycled for re-use.

DESCRIPTION OF BEST MODE OF THE INVENTION

Figure 1:
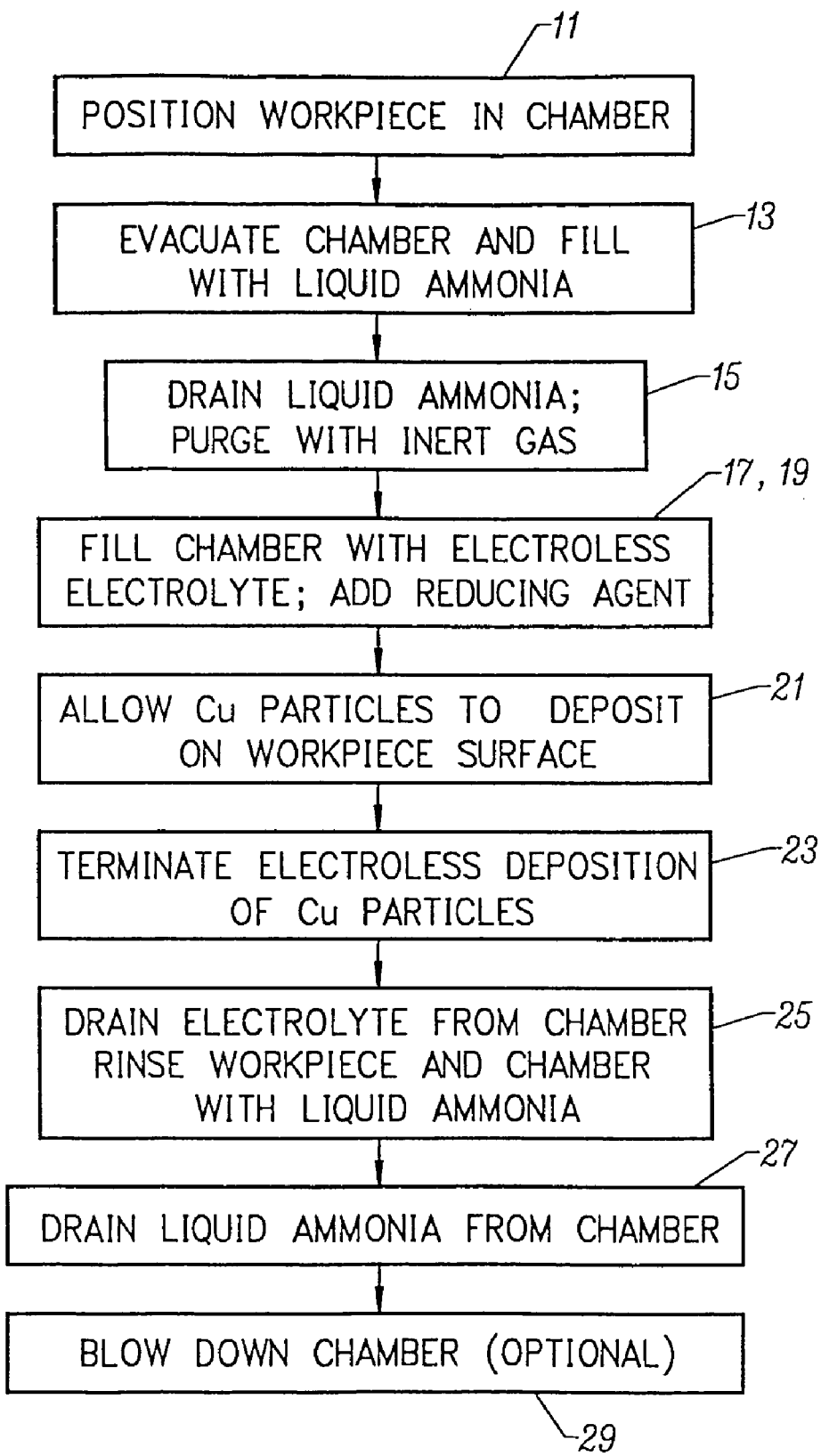
FIGS. 1, 2 and 3 are flow charts illustrating practice of the invention.

In a first alternative process, shown in a flow chart in FIG. 1, the process begins, in step 11, by positioning a workpiece, such as a wafer, on which a copper surface is to be deposited in a processing chamber. In step 13, the chamber is evacuated (preferably to a vacuum of at least $10^{-4}$ Torr) and the chamber is filled with liquid $NH_3$ at a suitable pressure and temperature. In step 15, the liquid ammonia is drained and the chamber is purged with $N_2$ or another inert gas that preferably provides no free oxygen. In step 17, the chamber is partly or wholly filled with a selected electroless electrolyte containing Cu (e.g., $CuCl_a$, $CuBr_b$ or $CuI_c$ with a, b and c≈1–2 or a copper amine $NCuR_1R_2$), and in step 19 a selected reducing agent is added to produce free electrons that combines with Cu ions to form Cu metal particles. In step 21, the Cu metal particles are allowed to come out of solution and to deposit or plate on, and preferably bind to, an exposed surface of the workpiece, in step 23. Steps 21 and/or 23 are preferably carried out at a selected temperature T1 in the range −78° C.≦T1<90° C. The workpiece surface (s) is optionally rotated about an axis transverse to the workpiece exposed surface within the chamber, if desired, to improve uniformity of the thickness of the plated-out copper. The Cu metal is allowed to undergo electroless deposition to produce a surface of Cu metal of thickness Δh=0.1–2 μm (or higher, if desired) on the exposed surface of the workpiece.

In step 25, the electrolyte and reducing agent are drained from the chamber, and the workpiece and chamber is rinsed with liquid ammonia, to remove most or all of the remaining copper-containing electrolyte and/or organic substances and/or vapors that may be present. In step 27, the liquid ammonia is drained from the chamber and the chamber is purged with a selected inert gas. In step 29 (optional), the chamber is blown down to dry, preferably using an oxygen-free gas. In this alternative process, electroless deposition is used to deposit substantially all the Cu metal on the workpiece.

Figure 2:
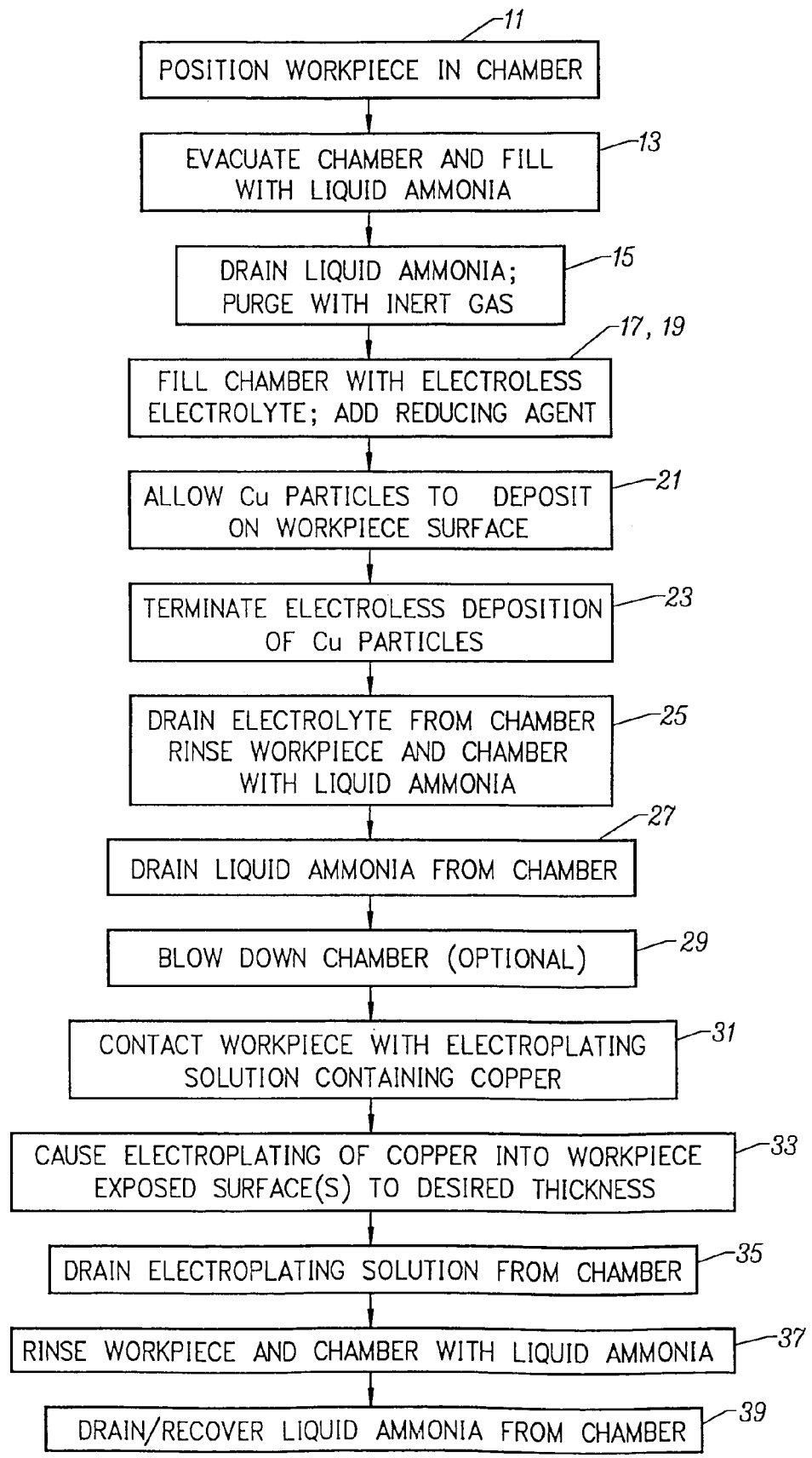

In a second alternative process, shown in FIG. 2, steps 11, 13, 15, 17, 19 and 21 are performed as in FIG. 1. In step 23', the electroless copper deposition is terminated after a selected copper thickness Δh=0.01–0.1 μm is obtained as a copper seed or substrate on the workpiece surface. Provision of a seed surface of Cu metal may be preferred, for at least two reasons: (1) the bulk electrical conductivity of the seed surface is increased to a point where electroplating can be applied, if desired, to further increase the Cu thickness of the surface; and (2) the seed surface of Cu provides a more suitable surface to which the Cu particles can subsequently bind. Steps 25, 27 and 29 are carried through as in the first alternative process.

In step 31 in the second alternative process, the workpiece in the chamber is submerged in, or contacted with, an electroplating copper solution dissolved in liquid ammonia, maintained at a selected temperature T2 in the range $-78°$ C.$\leq$T2$\leq$90° C. In step 33, copper in the electroplating solution is caused to plate onto one or more exposed surfaces of the copper-seeded workpiece, using electrical contacts connected to the workpiece (cathode) and to an electrically conducting plate (anode) immersed in the electroplating solution. The electroplating voltage used for this plating step is preferably about 0.32 volts, or preferably a higher value, for copper. The total thickness of copper plated onto the workpiece surface(s) is controllable by variation of the anode-cathode voltage and by variation of the time interval for which this plating step is continued. A suitable thickness $\Delta h$ of copper plated onto the workpiece surface(s) is $\Delta h$=0.1–2 µm but may be higher or lower if desired. The rate r at which copper deposition occurs will vary with the plating voltage V and with the plating temperature T3. A suitable range of plating voltage V(plate) is 0.3 volts$\leq$V (plate)$\leq$1 volts but may be higher if an enhanced rate of deposit is desired. The electroplating time interval length $\Delta t$ may be in the range 15 sec$\leq$$\Delta t$$\leq$300 sec.

The remaining electroplating solution is drained from the chamber, in step 35, and the workpiece and chamber are rinsed with liquid ammonia, in step 37. Liquid ammonia and any remaining vapor are drained or otherwise removed from the second chamber and captured to recover the ammonia liquid and gas, in step 39. This process provides electroplating of Cu metal onto a "seed" surface of Cu deposited by electroless deposition.

Figure 3:
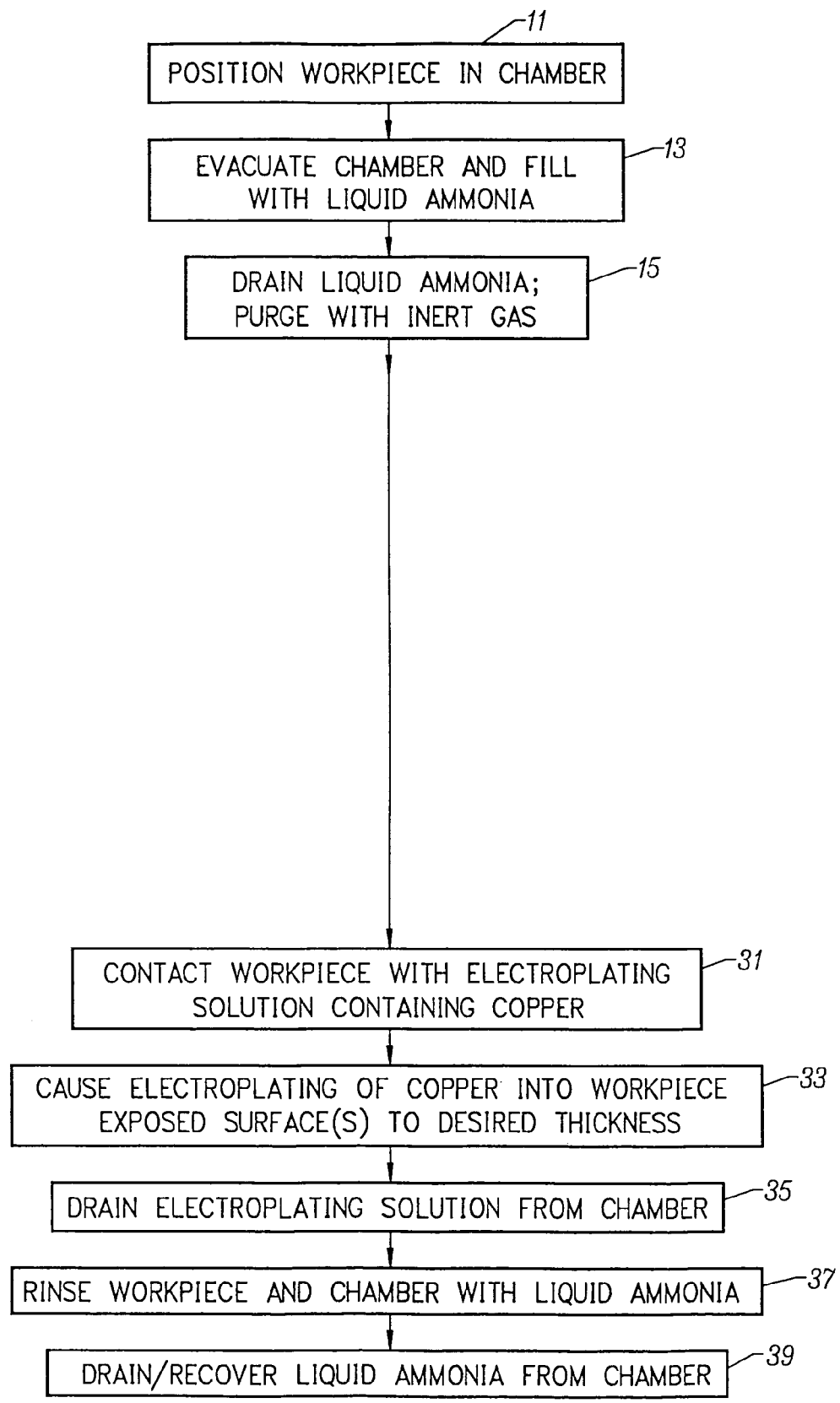

In a third alternative process, illustrated in FIG. 3, steps 11, 13, 15, 31, 33, 35, 37 and 39 are performed as in the first or second alternative process. In this third alternative process, an electroplating process is used to deposit substantially all the Cu metal onto the workpiece surface(s). This third alternative process will often require more time to complete than is required by the first or second alternative processes, for modest Cu thicknesses. If the workpiece surface is plastic or a similar polymer, initial deposit of graphite on the exposed surface may enhance Cu plate-out in an electroplating-only process.

Figure 4:
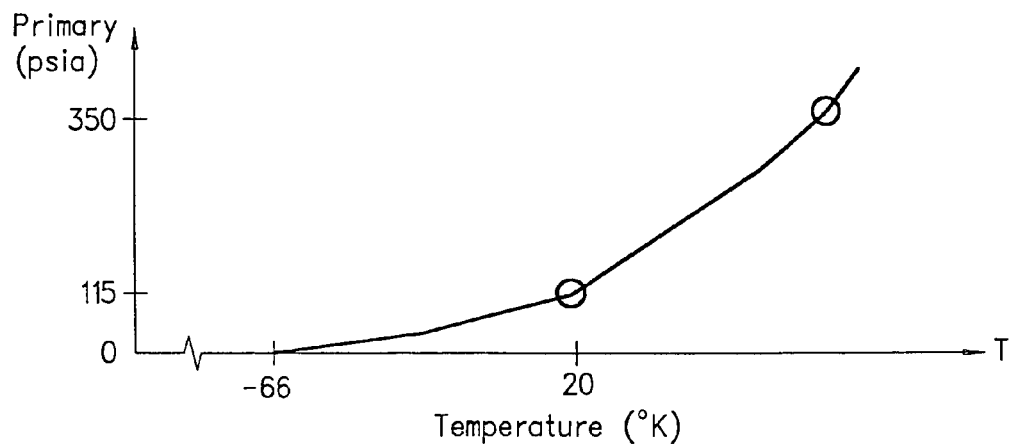
FIG. 4 is a graphical view of the approximate pressure required to maintain ammonia in liquid form, as a function of ambient temperature.

FIG. 4 is a graphical view of the approximate minimum pressure p(min) required to maintain ammonia in liquid form. The chamber pressure p required to maintain the ammonia in liquid form will depend upon, and increase with, the temperature T. For the range of temperatures T1, the pressure p will vary from about 0 psig to around 350 psig. By using a solution temperature T that is no more than about $-66°$ C., the process steps 31, 33 and 35 may be carried out at normal atmospheric pressure or less.

The process occurs in a completely closed system, within the processing chamber, and the liquid ammonia used in the process is substantially completely recovered for reuse. The copper salts and organics removed from the chamber can be recycled or disposed of, as desired. The wafer or other workpiece remains in the chamber during the entire process so that no movement or transport of the workpiece is required here, until the copper deposit process is completed. Further, this process uses only liquid ammonia, not water, so that little or no oxygen is available to combine with the copper metal to form a weaker oxidized form of copper with smaller electrical conductivity and different material characteristics.

Figure 5:
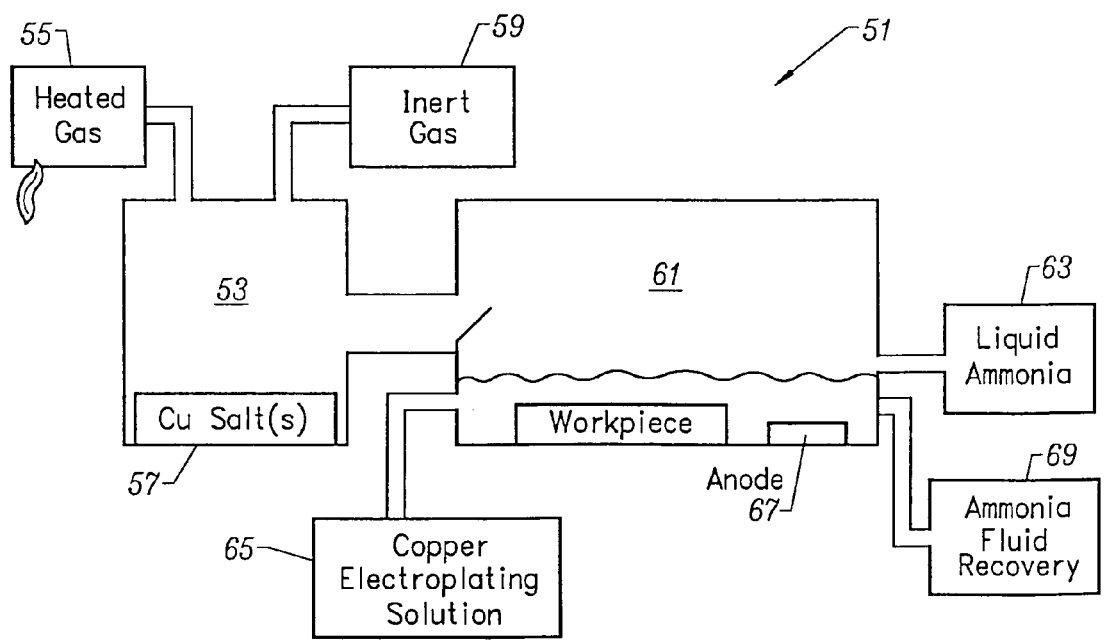
FIG. 5 is a schematic view of apparatus suitable for practice of the invention.

FIG. 5 schematically illustrates apparatus 51 suitable for practicing the invention. The apparatus includes a closed processing chamber 53, a source of Cu-containing electrolyte liquid 55 (optional), a source 57 of inert gas for chamber purging, a source 59 of liquid ammonia, a source 61 (optional) of a selected copper electroplating solution (which may be, or may not be, the same as the source 55), one or more anodes 63 (preferably copper, platinum or another metal that resists dissolving in the electroplating solution) positioned within the chamber 53. The apparatus 51 also includes an ammonia fluid recycling and recovery system 65 that receives ammonia fluid, metal salts and organics from the chamber 53 and recovers the ammonia (and, optionally, the metal electrolytes and organics).

This deposit process can be applied to deposit of other metals that are in similar positions in the periodic table, including Cu ($E^0$=0.32 volts at 25° C.), Ag ($E^0$×0.8 volts), Au, Ni, Pd, Pt, Fe ($E^0$=−0.44 volts), Co, Zn ($E^0$=−0.76 volts) and Cd ($E^0$≈0.9 volts), all with similar reactions in the presence of (liquid) ammonia. The choice of electroplating solution, and also the choice of anode, will vary with the metal selected to deposit on the workpiece exposed surface.

What is claimed is:

1. A method for controllable deposit of a metal on a surface of an object, the method comprising:
   contacting an electroplating solution including a selected metal and liquid ammonia ($NH_3$) with an exposed surface of a selected object; and
   causing the selected metal in the electroplating solution to deposit on the exposed surface of the selected object until a selected thickness of the selected metal has been deposited on the exposed surface of the object.

2. The method of claim 1 wherein said metal is selected from a group of metals consisting of Cu, Ag, Au, Ni, Pd, Pt, Fe, Co, Zn and Cd.

3. The method of claim 1 where the electroplating deposit process is performed at a temperature ranging from $-78°$ Celcius to 90° Celcius.

4. The method of claim 1 wherein the electroplating deposit process is performed at a temperature of 20° Celcius.

5. The method of claim 4 wherein the electroplating deposit process is performed at a pressure of 150 psig.

6. The method of claim 1 further comprising removing the remaining electroplating solution and rinsing the exposed surface of the object in liquid ammonia when a second selected thickness of the selected metal has been deposited on the object exposed surface.

7. The method of claim 1 further comprising choosing Cu as said selected metal.

8. The method of claim 1 further comprising choosing said object to include a semiconductor material.

9. The method of claim 1 wherein causing the selected metal in the electroplating solution to deposit on the exposed surface of the selected object occurs at a selected rate.

10. The method of claim 1 further comprising rotating said object about an axis that is transverse to said object surface during at least a portion of said electroplating deposit process.

11. The method of claim 1 further comprising providing an electrically conducting plate within the electroplating solution.

12. The method of claim 11 further comprising providing a selected voltage difference $\Delta V$ between the exposed surface of the object and the electrically conducting plate of $\Delta t$ least about 0.3 volts for a time interval of selected length $\Delta t$ in a range of 15 sec $\leq \Delta t \leq$ 300 sec.

13. A method for controllable deposit of a metal on a surface of a object, the method comprising:
using electroless deposition to provide a thickness of copper metal on an exposed surface of a selected object wherein the process of electroless deposition of the metal on the object exposed surface comprises:
contacting the exposed surface of the object with a fluid that includes a mixture of liquid ammonia and a selected electroless electrolyte including a selected metal; and
allowing a portion of the selected metal in the electroless electrolyte to deposit on the exposed surface of the object.

14. The method of claim 13 wherein the electroless electrolyte is a copper halide.

15. The method of claim 13 wherein the electroless electrolyte is a copper amine.

16. The method of claim 13 further comprising adding a reducing agent.

17. The method of claim 13 where the electroless deposition process is performed at a temperature ranging from −78° Celcius to 90° Celcius and at a pressure ranging from 0 to 350 psig.

18. The method of claim 13 wherein the electroless deposition process is performed at a temperature of 20° Celcius.

19. The method of claim 18 wherein the electroless deposition process is performed at pressure of 150 psig.

20. A method for controllable deposit of a metal on a surface of a object, the method comprising:
using electroless deposition to provide a seed thickness of a selected metal on an exposed surface of a selected object; and
contacting an electroplating solution including the selected metal and liquid ammonia with the exposed surface of the selected object; and
causing the selected metal in the electroplating solution to deposit on the exposed surface of the selected object.

21. The method of claim 20 where the metal is selected from a group of metals consisting of Cu, Ag, Au, Ni, Pd, Pt, Fe, Co, Zn and Cd.

22. The method of claim 20 wherein electroless deposition of the metal on the exposed surface of the object comprises:
contacting the exposed surface of the object with a fluid that includes a mixture of liquid ammonia and a copper halide or a copper amine; and
allowing a portion of the copper in the copper halide or copper amine to deposit on the exposed surface of the object.

23. The method of claim 22 further comprising performing said electroless deposition process at a pressure p in a selected range 0 psig $\leq$ p $\leq$ 350 psig and at a selected temperature T in the range −78° Celcius $\leq$ T $\leq$ 90° Celcius.

24. The method of claim 22 wherein said electroless deposition occurs at a temperature of 20° Celcius.

25. The method of claim 24 wherein said pressure is 150 psig.

26. A method for controllable deposit of a metal on a surface of a wafer, the method comprising:
contacting an electroplating solution including a selected metal and liquid ammonia ($NH_3$) with an exposed surface of a selected semiconductor material; and
causing the selected metal in the electroplating solution to deposit on the exposed surface of the selected semiconductor material.

27. The method of claim 26 wherein the metal is selected from a group of metals consisting of Cu, Ag, Au, Ni, Pd, Pt, Fe, Co, Zn and Cd.

28. The method of claim 26 further comprising providing an electrically conducting plate within the electroplating solution.

29. The method of claim 28 further comprising providing a selected voltage difference $\Delta V$ between the exposed surface of the wafer and the electrically conducting plate of at least about 0.3 volts for a time interval of selected length $\Delta t$ in a range 15 sec $\leq \Delta t \leq$ 300 sec.

30. The method of claim 26 wherein said semiconductor material is a wafer.

31. The method of claim 26 wherein said selected semiconductor material includes a circuit.

32. The method of claim 31 further comprising generating a surface comprised of said selected metal in the circuit of the selected semiconductor material.

33. The method of claim 31 further comprising generating a contact comprised of said selected metal in the circuit of the selected semiconductor material.

34. The method of claim 26 further comprising generating surface comprised of said selected metal in the selected semiconductor material.

35. The method of claim 26 further comprising generating a contact comprised of said selected metal in the selected semiconductor material.

* * * * *